(12) United States Patent
Yip

(10) Patent No.: US 10,847,526 B1
(45) Date of Patent: Nov. 24, 2020

(54) MICROELECTRONIC DEVICES INCLUDING STAIRCASE STRUCTURES, AND RELATED MEMORY DEVICES AND ELECTRONIC SYSTEMS

(71) Applicant: Micron Technology, Inc., Boise, ID (US)

(72) Inventor: Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/523,662

(22) Filed: Jul. 26, 2019

(51) Int. Cl.
| | | |
|---|---|---|
| H01L 27/11529 | (2017.01) | |
| H01L 27/11582 | (2017.01) | |
| H01L 27/11573 | (2017.01) | |
| H01L 27/11556 | (2017.01) | |
| H01L 27/11519 | (2017.01) | |
| H01L 27/11575 | (2017.01) | |
| H01L 27/11565 | (2017.01) | |
| H01L 27/11548 | (2017.01) | |
| H01L 27/1157 | (2017.01) | |
| H01L 27/11524 | (2017.01) | |

(52) U.S. Cl.
CPC .... H01L 27/11529 (2013.01); H01L 27/1157 (2013.01); H01L 27/11519 (2013.01); H01L 27/11524 (2013.01); H01L 27/11548 (2013.01); H01L 27/11556 (2013.01); H01L 27/11565 (2013.01); H01L 27/11573 (2013.01); H01L 27/11575 (2013.01); H01L 27/11582 (2013.01)

(58) Field of Classification Search
CPC ......... H01L 27/11213; H01L 27/11286; H01L 27/11293
See application file for complete search history.

(56) References Cited

U.S. PATENT DOCUMENTS

| | | | |
|---|---|---|---|
| 5,920,506 | A | 7/1999 | Wang et al. |
| 6,762,959 | B2 | 7/2004 | Kim |
| 7,049,652 | B2 | 5/2006 | Mokhlesi et al. |
| 7,154,779 | B2 | 12/2006 | Mokhlesi et al. |
| 8,164,951 | B2 | 4/2012 | Nazarian et al. |
| 8,542,534 | B2 | 9/2013 | Yamada et al. |
| 8,638,608 | B2 | 1/2014 | Lai et al. |
| 8,933,502 | B2 | 1/2015 | Higashitani et al. |
| 8,951,859 | B2 | 2/2015 | Higashitani et al. |

(Continued)

Primary Examiner — Cheung Lee
(74) Attorney, Agent, or Firm — TraskBritt

(57) ABSTRACT

A microelectronic device comprises a stack structure having tiers each including a conductive structure and an insulating structure, the stack structure comprises a staircase region comprising staircase structures, a select gate contact region, and a memory array region between the staircase region and the select gate contact region; contact structures on steps of the staircase structures; string drivers coupled to the contact structures and comprising transistors underlying and within horizontal boundaries of the staircase region; a triple well structure underlying the memory array region; a select gate structure between the stack structure and the triple well structure; semiconductive pillar structures within horizontal boundaries of the memory array region and extending through the stack structure and the select gate structure to the triple well structure; and a select gate contact structure within horizontal boundaries of the select gate contact region and extending through the stack structure to the select gate structure.

25 Claims, 3 Drawing Sheets

(56) References Cited

U.S. PATENT DOCUMENTS

| | | |
|---|---|---|
| 9,030,877 B2 | 5/2015 | Strenz et al. |
| 9,165,937 B2 | 10/2015 | Yip et al. |
| 9,412,451 B2 | 8/2016 | Tanzawa et al. |
| 9,449,966 B2 | 9/2016 | Chen |
| 9,589,978 B1 | 3/2017 | Yip |
| 9,728,548 B2 | 8/2017 | Freeman et al. |
| 9,941,209 B2 | 4/2018 | Tessariol et al. |
| 2006/0120154 A1 | 6/2006 | Lee |
| 2012/0068253 A1 | 3/2012 | Oota et al. |
| 2013/0009274 A1 | 1/2013 | Lee et al. |
| 2013/0020647 A1 | 1/2013 | Hwang et al. |
| 2020/0127006 A1* | 4/2020 | Otsu .................. H01L 23/5226 |

* cited by examiner

US 10,847,526 B1

MICROELECTRONIC DEVICES INCLUDING STAIRCASE STRUCTURES, AND RELATED MEMORY DEVICES AND ELECTRONIC SYSTEMS

TECHNICAL FIELD

The disclosure, in various embodiments, relates generally to the field of microelectronic device design and fabrication. More specifically, the disclosure relates to microelectronic devices including staircase structures, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structures at edges (e.g., horizontal ends) of the tiers of conductive structures. The staircase structure includes individual "steps" defining contact regions of the conductive structures upon which conductive contact structures can be positioned to provide electrical access to the conductive structures.

As vertical memory array technology has advanced, additional memory density has been provided by forming vertical memory arrays to include additional tiers of conductive structures, and, hence, additional staircase structures and/or additional steps in individual staircase structures associated therewith. However, increasing the quantity of tiers of conductive structures (and, hence, the quantity of staircase structures and/or the quantity of steps in individual staircase structures) of a stack structure without undesirably increasing the overall width (e.g., lateral footprint) of the stack structure can result in complex and congested routing paths to electrically connect the conductive structures to additional components (e.g., string drivers) of the memory device. Such complex and congested routing paths may impede (or even prevent) desirable connection paths from and between other components of the memory device.

In view of the foregoing, there remains a need for new microelectronic device (e.g., memory device, such as 3D NAND Flash memory device) configurations facilitating enhanced memory density while alleviating the problems (e.g., routing congestion, connection obstacles) of conventional microelectronic device configurations, as well as for new electronic systems including the new microelectronic device configurations.

DETAILED DESCRIPTION

Figure 1A:
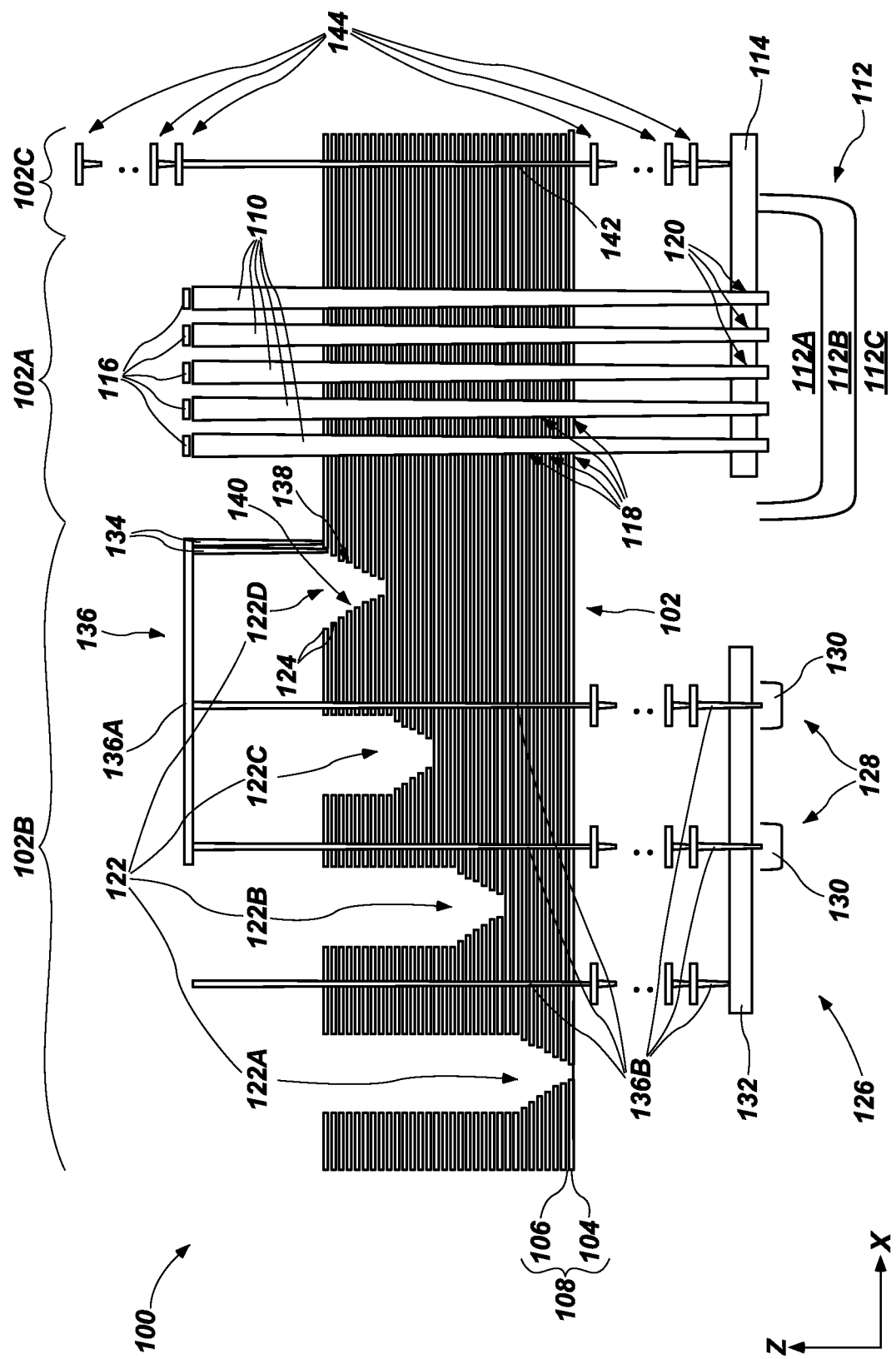
FIG. 1A is a simplified, partial cross-sectional view of a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, "vertically-neighboring" or "longitudinally-neighboring" features (e.g., regions, structures, devices) means and includes features located most vertically proximate (e.g., vertically closest) one another. In addition, as used herein, "horizontally-neighboring" or "laterally-neighboring" features (e.g., regions, structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Figure 1B:
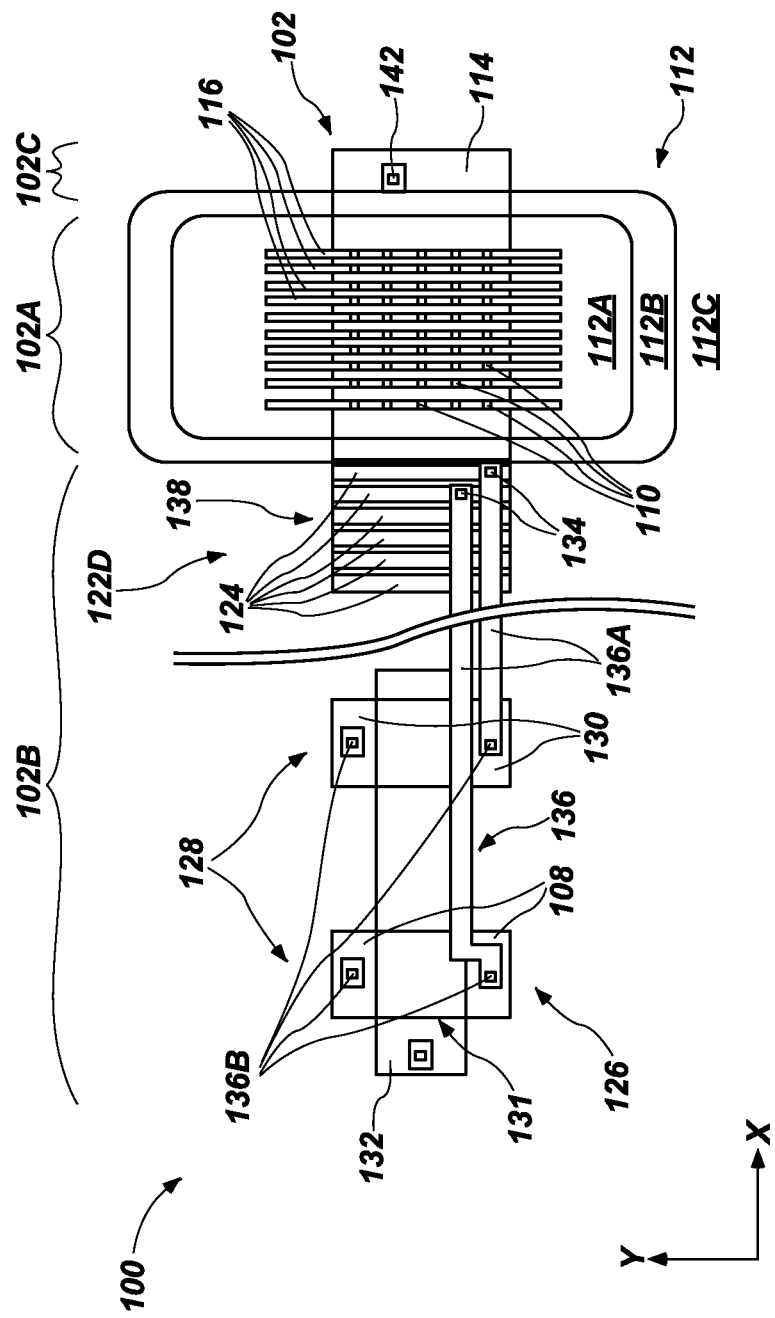
FIG. 1B is a simplified, partial top-down view of a portion of the microelectronic device shown in FIG. 1A.

FIG. 1A is a simplified, partial cross-sectional view of a microelectronic device 100 (e.g., a semiconductor device; a memory device, such as a 3D NAND Flash memory device), in accordance with embodiments of the disclosure. FIG. 1B is a simplified, partial top-down view of a portion of the microelectronic device 100 shown in FIG. 1A. For clarity and ease of understanding of the drawings and related description, not all components (e.g., features, structure, device) of the microelectronic device 100 depicted in FIG. 1A are depicted in FIG. 1B. For example, some components of the microelectronic device 100 vertically overlying other components of the microelectronic device 100 are not shown in FIG. 1B so as to provide a clearer top-down view of the other components. In addition, some horizontal portions of the microelectronic device 100 have been omitted (as indicated by the broken line in FIG. 1B intersecting the microelectronic device 100) to focus on particular aspects of the microelectronic device 100 in the top-down view of FIG. 1B.

Referring to FIG. 1A, the microelectronic device 100 includes a stack structure 102 including a vertically alternating (e.g., in the Z-direction) sequence of conductive structures 104 (e.g., access line plates, word line plates) and insulating structures 106 arranged in tiers 108. In addition, as shown in FIG. 1A, the stack structure 102 includes a memory array region 102A, a distributed staircase region 102B horizontally-neighboring (e.g., in the X-direction) a first horizontal boundary of the memory array region 102A, and a select gate contact region 102C horizontally-neighboring (e.g., in the X-direction) a second horizontal boundary of the memory array region 102A opposing the first lateral boundary of the memory array region 102A. The memory array region 102A of the stack structure 102 may be horizontally interposed between the distributed staircase region 102B of the stack structure 102 and the Select gate contact region 102C of the stack structure 102. As described in further detail below, the microelectronic device 100 further includes additional components (e.g., features, structures, devices) within boundaries of the different horizontal regions (e.g., the memory array region 102A, the distributed staircase region 102B, the select gate contact region 102C) of the stack structure 102.

Each of the tiers 108 of the stack structure 102 of the microelectronic device 100 may include one (1) of the conductive structures 104 vertically-neighboring one of the insulating structures 106. The stack structure 102 may include a desired quantity of the tiers 108. As shown in FIG. 1A, in some embodiments, the stack structure 102 includes thirty-two (32) of the tiers 108 of the conductive structures 104 and insulating structures 106. In additional embodiments, the stack structure 102 includes a different number of the tiers 108, such as less than thirty-two (32) of the tiers 108 of the conductive structures 104 and insulating structures 106 (e.g., less than or equal to thirty (30) of the tiers 108, less than or equal to twenty (20) of the tiers 108, less than or equal to ten (10) of the tiers 108); or greater than thirty-two (32) of the tiers 108 (e.g., greater than or equal to fifty (50) of the tiers 108, greater than or equal to one hundred (100) of the tiers 108) of the conductive structures 104 and insulating structures 106.

The conductive structures 104 of the tiers 108 of the stack structure 102 may be formed of and include at least one conductive material, such as a conductively-doped semiconductor material (e.g., conductively-doped polysilicon, conductively-doped germanium (Ge), conductively-doped silicon germanium (SiGe)), a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), or combinations thereof. In some embodiments, the conductive structures 104 are formed of and include conductively-doped polysilicon. In additional embodiments, the conductive structures 104 are formed of and include a metallic material (e.g., a metal, such as W; an alloy). Each of the conductive structures 104 may individually include a substantially homogeneous distribution of the at least one conductive material, or a substantially heterogeneous distribution of the at least one conductive material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 104 of each of the tiers 108 of the stack structure 102 exhibits a substantially homogeneous distribution of conductive material. In additional embodiments, at least one of the conductive structures 104 of at least one of the tiers 108 of the stack structure 102 exhibits a substantially heterogeneous distribution of at least one conductive material. The conductive structure 104 may, for example, be formed of and include a stack of at least two different conductive materials. The conductive structures 104 of each of the tiers 108 of the stack structure 102 may each be substantially planar, and may each exhibit a desired thickness.

The insulating structures 106 of the tiers 108 of the stack structure 102 may be formed of and include at least one insulating material, such as an oxide material (e.g., silicon dioxide ($SiO_2$), phosphosilicate glass, borosilicate glass, borophosphosilicate glass, fluorosilicate glass, titanium dioxide ($TiO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), a nitride material (e.g., silicon nitride ($Si_3N_4$)), an oxynitride material (e.g., silicon oxynitride), amorphous carbon, or a combination thereof. In some embodiments, the insulating structures 106 are formed of and include $SiO_2$. Each of the insulating structures 106 may individually include a substantially homogeneous distribution of the at least one insulating material, or a substantially heterogeneous distribution of the at least one insulating material. In some embodiments, each of the insulating structures 106 of each of the tiers 108 of the stack structure 102 exhibits a substantially homogeneous distribution of insulating material. In additional embodiments, at least one of the insulating structures 106 of at least one of the tiers 108 of the stack structure 102 exhibits a substantially heterogeneous distribution of at least one insulating material. The insulating structure 106 may, for example, be formed of and include a stack (e.g., laminate) of at least two different insulating materials. The insulating structures 106 of each of the tiers 108 of the stack structure 102 may each be substantially planar, and may each individually exhibit a desired thickness.

With continued reference to FIG. 1A, within horizontal boundaries (e.g., in the X-direction) of the memory array region 102A of the stack structure 102, the microelectronic device 100 may include vertically-extending pillar structures 110, a triple well structure 112, a select gate structure 114 (e.g., a select gate source (SGS) structure), and digit lines 116 (e.g., bit lines). The triple well structure 112 may vertically underlie (e.g., in the Z-direction) the memory array region 102A of the stack structure 102. The select gate structure 114 may be vertically interposed between the memory array region 102A of the stack structure 102 and the triple well structure 112. The digit lines 116 (e.g., bit lines) may vertically overlie the memory array region 102A of the stack structure 102. The vertically-extending pillar structures 110 vertically extend from the digit lines 116, through each of the memory array region 102A of stack structure 102 and the select gate structure 114, and to the triple well structure 112.

Each of the vertically-extending pillar structures 110 may include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the vertically-extending pillar structures 110 and the conductive structures 104 of the tiers 108 of the stack structure 102 may define vertically-extending strings of memory cells 118 coupled in series with one another within the memory array region 102A of the stack structure 102. In some embodiments, the memory cells 118 formed at the intersections of the conductive structures 104 and the vertically-extending pillar structures 110 within each the tiers 108 of the stack structure 102 comprise so-called "MONOS" (metal-oxide-nitride-oxide-semiconductor) memory cells. In additional embodiments, the memory cells 118 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 118 comprise so-called "floating gate" memory cells including floating gates (e.g., metallic floating gates) as charge storage structures. The floating gates may horizontally intervene between the central structures of the vertically-extending pillar structures 110 and the conductive structures 104 of the different tiers 108 of the stack structure 102. The microelectronic device 100 may include any desired quantity and distribution of the vertically-extending pillar structures 110 within the memory array region 102A of the stack structure 102.

With continued reference to FIG. 1A, the triple well structure 112 includes a P-well 112A, an N-well 112B, and a P-type base structure 112C (e.g., a P-substrate). The P-well 112A is located within the N-well 112B, and the N-well 112B is located within the P-type base structure 112C. The P-well 112A may comprise a semiconductive material (e.g., a silicon material, such as a monocrystalline silicon or polycrystalline silicon; a silicon-germanium material; a germanium material; a gallium arsenide material; a gallium nitride material; an indium phosphide material; a combination thereof) doped with at least one P-type dopant (e.g., one or more of boron, aluminum, and gallium). The N-well 112B may comprise the semiconductive material doped with at least one N-type dopant (e.g., one or more of phosphorus, arsenic, antimony, and bismuth). The P-type base structure 112C may comprise the semiconductive material doped with at least one P-type dopant (e.g., one or more of boron, aluminum, and gallium). As shown in FIG. 1A, the vertically-extending pillar structures 110 within the horizontal boundaries of the memory array region 102A of the stack structure 102 may vertically extend into the P-well 112A of the triple well structure 112.

The select gate structure 114 (e.g., SGS structure) may vertically overlie (e.g., in the Z-direction) the triple well structure 112 and may vertically underlie a lowermost tier 108 of the stack structure 102. As shown in FIG. 1A, a portion of the select gate structure 114 may be positioned within the horizontal boundaries (e.g., in the X-direction) of the memory array region 102A of the stack structure 102. Another portion of the select gate structure 114 may be located within the horizontal boundaries (e.g., in the X-direction) of the select gate contact region 102C of the stack structure 102 for connection with at least one select gate contact structure, as described in further detail below.

The select gate structure 114 may be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In addition, the select gate structure 114 and the conductive structures 104 of the stack structure 102 may have substantially the same material composition as one another, or may have different material compositions than one another. In some embodiments, the select gate structure 114 is formed of and includes conductively-doped polysilicon.

The select gate structure 114 may be electrically coupled to the vertically-extending pillar structures 110 of the microelectronic device 100. Intersections of the vertically-extending pillar structures 110 and the select gate structure 114 may define select gate devices 120 (e.g., SGS devices, such as SGS transistors) of the microelectronic device 100. Portions of the vertically-extending pillar structures 110 intersecting the select gate structure 114 may be free of charge storage structures horizontally-intervening between the semiconductive pillars (e.g., polysilicon pillars, silicon-germanium pillars) of the vertically-extending pillar structures 110 and the select gate structure 114. For example, the semiconductive pillars of the vertically-extending pillar structures 110 may directly physically contact the select gate structure 114.

As shown in FIG. 1A, the select gate structure 114 may vertically offset (e.g., in the Z-direction) from the conductive structure 104 of a lowermost tier 108 of the stack structure 102 by a different distance (e.g., a greater distance) than a distance intervening between the conductive structures 104 of vertically-neighboring tiers 108 of the stack structure 102. In addition, the select gate structure 114 may have a different thickness (e.g., height in the Z-direction) than the conductive structures 104 of the stack structure 102, such as a greater thickness than the thicknesses of the conductive structures 104. The select gate structure 114 may be formed (e.g., using conventional processes, such as conventional material deposition process and conventional material removal processes) prior to the formation of the conductive structures 104 of the stack structure 102.

The digit lines 116 may vertically overlie (e.g., in the Z-direction) an uppermost tier 108 of the stack structure 102. At least a portion of each of the digit lines 116 may be positioned within the horizontal boundaries (e.g., in the X-direction) of the memory array region 102A of the stack structure 102. The digit lines 116 may be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). The digit lines 116 may be may be electrically coupled to the vertically-extending pillar structures 110 (e.g., by way of conductive contact structures).

Optionally, an additional select gate structure (e.g., a SGD structure, such as an SGD plate) may be vertically positioned between the digit lines 116 and the uppermost tier 108 of the stack structure 102. If present, at least a portion of the additional select gate structure may be positioned within the horizontal boundaries (e.g., in the X-direction) of the memory array region 102A of the stack structure 102. The additional select gate structure (if any) may be formed of and include at least one electrically conductive material (e.g., a conductively-doped semiconductor material, a metal, an alloy, a conductive metal-containing material), and may be may be electrically coupled to the vertically-extending pillar structures 110. Intersections of the vertically-extending pillar structures 110 and the additional select gate structure may define additional select gate devices (e.g., SGD devices, such as SGD transistors) of the microelectronic device 100. Portions of the vertically-extending pillar structures 110 intersecting the additional select gate structure (if any) may be free of charge storage structures horizontally-intervening between the semiconductive pillars (e.g., polysilicon pillars, silicon-germanium pillars) of the vertically-extending pillar structures 110 and the additional select gate structure. In additional embodiments, one or more upper conductive structure(s) 104 of the stack structure 102 (e.g., the conductive structure 104 of the uppermost tier 108 of the stack structure 102) may be employed as an additional select gate structure.

With continued reference to FIG. 1A, within horizontal boundaries (e.g., in the X-direction) of the distributed staircase region 102B of the stack structure 102, the microelectronic device 100 may include stadium structures 122 distributed within the stack structure 102 and each individually including steps 124 (e.g., contact regions) defined by horizontal ends of the tiers 108, and string drivers 126 including transistors 128 (e.g., so-called "pass gates") vertically underlying (e.g., in the Z-direction) the distributed staircase region 102B. In addition, the microelectronic device 100 may further include conductive contact structures 134 (e.g., access line contacts, word line contacts) physically and electrically contacting the steps 124 of the stadium structures 122 to provide electrical access to the conductive structures 104 of the stack structure 102; and conductive routing structures 136 (e.g., access line routing structures, word line routing structures) extending from and between the conductive contact structures 134 and the transistors 128 of the string drivers 126.

As shown in FIG. 1A, the distributed staircase region 102B of the stack structure 102 may include multiple (e.g., more than one) stadium structures 122 positioned at different elevations than one another within the stack structure 102. For example, the distributed staircase region 102B of the stack structure 102 may include a first stadium structure 122A, a second stadium structure 122B at a relatively lower vertical position (e.g., in the Z-direction) within the stack structure 102 than the first stadium structure 122A, a third stadium structure 122C at a relatively lower vertical position within the stack structure 102 than the second stadium structure 122B, and a fourth stadium structure 122D at a relatively lower vertical position within the stack structure 102 than the third stadium structure 122C. The different vertical positions of the different stadium structures 122 (e.g., the first stadium structure 122A, the second stadium structure 122B, the third stadium structure 122C, the fourth stadium structure 122D) permits electrical connections between the conductive structures 104 of the tiers 108 at the different vertical positions of the different stadium structures 122 and other components (e.g., the string drivers 126) of the microelectronic device 100.

The distributed staircase region 102B of the stack structure 102 may include any desired quantity and distribution (e.g., spacing and arrangement) of the stadium structures 122. As shown in FIG. 1A, in some embodiments, the distributed staircase region 102B of the stack structure 102 includes four (4) of the stadium structures 122; the stadium structures 122 are substantially uniformly (e.g., equally, evenly) spaced; and vertical positions (e.g., in the Z-direction) of the stadium structures 122 within the stack structure 102 become deeper (e.g., vertically farther from a uppermost surface of the stack structure 102, vertically closer to the lowermost surface of the stack structure 102) in a direction (e.g., the X direction) horizontally-extending away from the memory array region 102A (and, hence, the vertically-extending pillar structures 110 thereof) of the stack structure 102. In additional embodiments, the distributed staircase region 102B of the stack structure 102 may include a different quantity of the stadium structures 122 and/or a different distribution of the stadium structures 122 than that depicted in FIG. 1A. For example, the distributed staircase region 102B of the stack structure 102 may include more than four (4) of the stadium structures 122 (e.g., greater than or equal to five (5) of the stadium structures 122, greater than or equal to ten (10) of the stadium structures 122, greater than or equal to twenty-five (25) of the stadium structures 122, greater than or equal to fifty (50) of the stadium structures 122), or less than four (4) of the stadium structures 122 (e.g., less than or equal to three (3) of the stadium structures 122, less than or equal to two (2) of the stadium structures 122, only one (1) of the stadium structures 122). As another example, the stadium structures 122 may be at least partially non-uniformly (e.g., non-equally, non-evenly) spaced, such that at least one of the stadium structures 122 is separated from at least two other of the stadium structures 122 laterally-neighboring (e.g., in the X-direction) the at least one stadium structure 122 by different (e.g., non-equal) distances. As an additional non-limiting example, vertical positions (e.g., in the Z-direction) of the stadium structures 122 within the stack structure 102 may become shallower (e.g., vertically closer to a uppermost surface of the stack structure 102, vertically farther from the lowermost surface of the stack structure 102) in a direction (e.g., the X direction) horizontally-extending away from the memory array region 102A of the stack structure 102, or may vary in another manner (e.g., may alternate between relatively deeper and relatively shallower vertical positions, may alternate between relatively shallower and relatively deeper vertical positions) in a direction horizontally-extending away from the memory array region 102A of the stack structure 102.

As shown in FIG. 1A, each of the stadium structures 122 may individually include a forward staircase structure 138 and a reverse staircase structure 140 that mirrors the forward staircase structure 138. A phantom line extending from a top of the forward staircase structure 138 to a bottom of the forward staircase structure 138 may have a positive slope, and another phantom line extending from a top of the reverse staircase structure 140 to a bottom of the reverse staircase structure 140 may have a negative slope. The forward staircase structure 138 and the reverse staircase structure 140 of each of the stadium structures 122 may serve as redundant and/or alternative means of connecting to one or more of the tiers 108 of the stack structure 102. In additional embodiments, the distributed staircase region 102B of the stack structure 102 may exhibit different configuration one or more of the stadium structures 122. As a non-limiting example, one or more (e.g., each) of the stadium structures 122 may be modified to include a forward staircase structure 138 but not a reverse staircase structure 140 (e.g., the reverse staircase structure 140 may be absent). As another non-limiting example, one or more (e.g., each) of the stadium structures 122 may be modified to include a reverse staircase structure 140 but not a forward staircase structure 138 (e.g., the forward staircase structure 138 may be absent).

Each of the stadium structures 122 within the distributed staircase region 102B of the stack structure 102 may individually include a desired quantity of steps 124. Each of the stadium structures 122 may include substantially the same quantity of steps 124 as each other of the stadium structures 122, or at least one of the stadium structures 122 may include a different quantity of steps 124 than at least one other of the stadium structures 122. In some embodiments, at least one of the stadium structures 122 includes a different (e.g., greater, lower) quantity of steps 124 than at least one other of the stadium structures 122.

As shown in FIG. 1A, in some embodiments, the steps 124 of each of the stadium structures 122 are arranged in order, such that steps 124 directly horizontally adjacent (e.g., in the X-direction) one another correspond to tiers 108 of the stack structure 102 directly vertically adjacent (e.g., in the Z-direction) one another. In additional embodiments, the steps 124 of one or more of the stadium structures 122 are arranged out of order, such that at least some steps 124 of the stadium structures 122 directly horizontally adjacent (e.g., in the X-direction) one another correspond to tiers 108 of stack structure 102 not directly vertically adjacent (e.g., in the Z-direction) one another.

With continued reference to FIG. 1A, the conductive contact structures 134 may be coupled to the conductive structures 104 of the tiers 108 at the steps 124 of the stadium structures 122, and may electrically couple the conductive structures 104 to the conductive routing structures 136 (and, hence, the string drivers 126) of the microelectronic device 100. The conductive contact structures 134 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive contact structures 134 may have substantially the same material composition, or at least one of the conductive contact structures 134 may have a different material composition than at least one other of the conductive contact structures 134.

Each of tiers 108 of the stack structure 102 may be coupled to at least one of the conductive contact structures 134 at one or more of the steps 124 of one or more of the stadium structures 122. For each of the stadium structures 122 (e.g., the first stadium structure 122A, the second stadium structure 122B, the third stadium structure 122C, the fourth stadium structure 122D), the conductive contact structures 134 may be formed on or over a single (e.g., only one) staircase structure thereof (e.g., the forward staircase structure 138 thereof, or the reverse staircase structure 140 thereof), or may be formed on or over multiple (e.g., more than one) of the staircase structures thereof (e.g., the forward staircase structure 138 thereof and the reverse staircase structure 140 thereof). As non-limiting example, for one or more of the stadium structures 122, each of the steps 124 of the forward staircase structure 138 thereof may have a conductive contact structure 134 thereon or thereover. As another non-limiting example, for one or more of the stadium structures 122, each of the steps 124 of the reverse staircase structure 140 thereof may have a conductive contact structure 134 thereon or thereover. As a further non-limiting example, for one or more of the stadium structures 122, at least a portion (e.g., less than or equal to all) the steps 124 of the forward staircase structure 138 thereof may each have a conductive contact structure 134 thereon or thereover, and at least a portion (e.g., less than or equal to all) the steps 124 of the reverse staircase structure 140 thereof may each have a conductive contact structure 134 thereon or thereover. In addition, conductive contact structures 134 formed on or over the same staircase structure (e.g., the forward staircase structure 138 or the reverse staircase structure 140) of the same stadium structure 122 (e.g., the first stadium structure 122A, the second stadium structure 122B, the third stadium structure 122C, or the fourth stadium structure 122D) may be substantially horizontally-aligned with one another (e.g., in the Y-direction shown in FIG. 1B), or may be at least partially non-aligned (e.g., offset) with one another (e.g., in the Y-direction shown in FIG. 1B). As shown in FIG. 1B, in some embodiments, conductive contact structures 134 formed on or over the same staircase structure (e.g., the forward staircase structure 138) of the same stadium structure 122 (e.g., the fourth stadium structure 122D) are horizontally-offset from one another in the Y-direction.

With returned reference to FIG. 1A, the string drivers 126 may vertically underlie the lowermost tier 108 of the stack structure 102, and may be positioned within the horizontal boundaries (e.g., in the X-direction) of the distributed staircase region 102B of the stack structure 102. The transistors 128 (e.g., pass gates) of the string drivers 126 may individually include source/drain regions 130 separated from one another (e.g., in the Y-direction shown in FIG. 1B) by a channel region 131 (FIG. 1B), and a gate structure 132 vertically overlying the channel region 131 (FIG. 1B). The gate structure 132 may horizontally extend between (e.g., in the X-direction) and by shared by multiple (e.g., more than one) transistors 128 of the string drivers 126, and may vertically intervene between the channel regions 131 of multiple transistors 128 and the lowermost tier 108 of the stack structure 102. A gate dielectric material (e.g., a dielectric oxide) may vertically intervene (e.g., in the Z-direction) between channel regions 131 of multiple transistors 128 and the gate structure 132.

In some embodiments, the transistors 128 comprise high voltage NMOS (HVNMOS) transistors. HVNMOS transistors are operative at higher voltages than NMOS transistors. For example, HVNMOS transistors may have threshold voltages greater than the threshold voltage range (e.g., from about +0.5V to about +0.7V) of NMOS transistors, such as a threshold voltages greater than or equal to about +3V higher than the threshold voltage range of NMOS transistors. In such embodiments, the source/drain regions 130 may comprise a semiconductive material (e.g., a silicon material, such a monocrystalline silicon or polycrystalline silicon; a silicon-germanium material; a germanium material; a gallium arsenide material; a gallium nitride material; an indium phosphide material; a combination thereof) doped with at least one N-type dopant (e.g., one or more of phosphorus, arsenic, antimony, and bismuth); the channel regions 131 may comprise the semiconductive material doped with at least one P-type dopant (e.g., one or more of boron, aluminum, and gallium); and the gate structure 132 may comprise at least one conductive material (e.g., one or more of a metal, an alloy, a conductive metal-containing material, and a conductively-doped semiconductor material).

As shown in FIG. 1A, the gate structure 132 of the transistors 128 of the string drivers 126 may be located at substantially the same vertical position (e.g., elevation in the Z-direction) within the microelectronic device 100 as the select gate structure 114. The gate structure 132 and the select gate structure 114 may also exhibit substantially the same thickness (e.g., height in the Z-direction), or may exhibit different thicknesses than one another. In addition, the gate structure 132 and the select gate structure 114 may have substantially the same material composition as one another, or may have different material compositions than one another. In some embodiments, gate structure 132 and the select gate structure 114 exhibits substantially the same thickness as one another, and have substantially the same material composition as one another. The gate structure 132 and the select gate structure 114 may, for example, be formed (e.g., simultaneously formed, sequentially formed) form patterning a common conductive material (e.g., conductively-doped polysilicon).

While FIGS. 1A and 1B depict the string drivers 126 as being located outside of horizontal boundaries of the triple well structure 112, in addition embodiments the string drivers 126 may be at least partially located within horizontal boundaries of the triple well structure 112 and/or another triple well structure. As a non-limiting example, in some additional embodiments, the triple well structure 112 horizontally extends into the horizontal area of distributed staircase region 102B (e.g., the horizontal area of the triple well structure 112 overlaps the horizontal areas of the distributed staircase region 102B and the memory array region 102A of the stack structure 102), and the string drivers 126 are at least partially located within the horizontal boundaries of the triple well structure 112. As another non-limiting example, in some additional embodiments, the microelectronic device 100 includes an additional triple well structure located within the horizontal boundaries of the distributed staircase region 102B of the stack structure 102, and the string drivers 126 are at least partially located within the horizontal boundaries of the additional triple well structure.

With returned reference to FIG. 1A, the conductive routing structures 136 may electrically connect the conductive contact structures 134 and the transistors 128 of the string drivers 126. The conductive routing structures 136 may, for example, extend from the conductive contact structures 134, through the distributed staircase region 102B of the stack structure 102 and to the source/drain regions 130 of the transistors 128 of the string drivers 126. As shown in FIG. 1A, the conductive routing structures 136 may include horizontally-extending regions 136A and vertically-extending regions 136B. At least some of the horizontally-extending regions 136A of the conductive routing structures 136 may horizontally extend (e.g., in one or more of the X-direction and the Y-direction) from the conductive contact structures 134 to the vertically-extending regions 136B of the conductive routing structures 136. In addition, at least some of the vertically-extending regions 136B of the conductive routing structures 136 may vertically extend (e.g., in the Z-direction) from the horizontally-extending regions 136A toward (e.g., to) the transistors 128 of the string drivers 126. In some embodiments, other of the horizontally-extending regions 136A (e.g., relatively vertically-lower horizontally-extending regions 136A) of the conductive routing structures 136 and/or other of the vertically-extending regions 136B (e.g., relatively vertically-lower vertically-extending regions 136B) of the conductive routing structures 136 extend between and electrically connect at least some of the vertically-extending regions 136B (e.g., relatively vertically-higher vertically-extending regions 136B) of the conductive routing structures 136 to the transistors 128 of the string drivers 126. Thus, the conductive routing structures 136 may form an electrical connection between the string drivers 126 and the conductive structures 104 of the different tiers 108 of the stack structure 102 to provide electrical access to the conductive structures 104 (e.g., for reading, writing, or erasing data associated with the memory cells 118 within the memory array region 102A of the stack structure 102).

The conductive routing structures 136 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive routing structures 136 may have substantially the same material composition, or at least one of the conductive routing structures 136 may have a different material composition than at least one other of the conductive routing structures 136.

With continued reference to FIG. 1A, within horizontal boundaries (e.g., in the X-direction) of the select gate contact region 102C of the stack structure 102, the microelectronic device 100 may include at least one select gate contact structure 142. As shown in FIG. 1A, the select gate contact structure 142 may vertically extend (e.g., in the Z-direction) through portions of the stack structure 102 within the select gate contact region 102C, and may be electrically coupled to the select gate structure 114 vertically underlying the stack structure 102.

The select gate contact structure 142 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). At least one dielectric material may at least partially surround the select gate contact structure 142. The dielectric material may, for example, be horizontally interposed between the select gate contact structure 142 and at the least the conductive structures 104 of the tiers 108 of the stack structure 102.

Since the select gate structure 114 may be located at substantially the same vertical position (e.g., elevation in the Z-direction) within the microelectronic device 100 as the gate structure 132 of the transistors 128 of the string drivers 126, positioning the select gate contact structure 142 within the select gate contact region 102C may permit an electrical connection between the select gate contact structure 142 and the select gate structure 114 that may otherwise not be possible (or would at least be significantly more complex) if the select gate structure 114 was located within horizontal boundaries of the distributed staircase region 102B of the stack structure 102. Namely, if the select gate contact structure 142 was located within horizontal boundaries of the distributed staircase region 102B of the stack structure 102 (e.g., so as to horizontally-neighbor one or more of the conductive contact structures 134), the position of the gate structure 132 of the transistors 128 of the string drivers 126 and/or the positions and paths of routing structures (e.g., the conductive routing structures 136) coupled to the gate structure 132 may substantially impede (or even prevent) electrical coupling the select gate contact structure 142 to the select gate structure 114. As shown in FIG. 1A, because the memory array region 102A of the stack structure 102 horizontally intervenes (e.g., in the X-direction) between the select gate contact region 102C of the stack structure 102 and the distributed staircase region 102B of the stack structure 102, the vertically-extending pillar structures 110 (and, hence, the memory cells 118 and select gate devices 120 associated therewith) of the microelectronic device 100 may be horizontally interposed between (e.g., in the X-direction) the select gate contact structure 142 and the conductive contact structures 134 of the microelectronic device 100.

The select gate contact structure 142 may have substantially the same material composition as the conductive contact structures 134, or may have a different material composition than that of the conductive contact structures 134 of the microelectronic device 100. In some embodiments, select gate contact structure 142 and the conductive contact structures 134 have substantially the same conductive material as one another. The select gate contact structure 142 and the conductive contact structures 134 may, for example, be formed using a common (e.g., the same) contact formation process module utilizing the conductive material.

With continued reference to FIG. 1A, the microelectronic device 100 may include additional routing structures electrically coupled to the select gate contact structure 142. As a non-limiting example, one or more additional routing structures may be vertically positioned (e.g., in the Z-direction) above the stack structure 102. In some embodiments, one or more of such additional routing structures extend (e.g., vertically extend, horizontally extend) between and electrically connect the select gate contact structure 142 to one or more additional components (e.g., features, structures, devices) of the microelectronic device 100. As another non-limiting example, one or more additional routing structures may vertically positioned (e.g., in the Z-direction) between the stack structure 102 and the select gate structure 114. In some embodiments, one or more of such additional routing structure(s) extend (e.g., vertically extend, horizontally extend) between and electrically connect the select gate contact structure 142 and the select gate structure 114. In additional embodiments, the select gate contact structure 142 vertically extends to and physically contacts the select gate structure 114.

As shown in FIG. 1A, the microelectronic device 100 includes metallization levels 144 located at different vertical positions (e.g., elevations in the Z-direction). Different metallization levels 144 may include different horizontally-extending conductive structures of the microelectronic device 100. By way of non-limiting example, one of the metallization levels 144 may overlie the stack structure 102, and may include at least some of the digit lines 116 and at least some of the horizontally-extending regions 136A of the conductive routing structures 136. Horizontally-extending conductive structures (e.g., the digit lines 116, the horizontally-extending regions 136A of the conductive routing structures 136) within the same metallization level 144 as one another may all have substantially the same material composition as one another, or at least one of the horizontally-extending conductive structures may have different material composition than at least one other of the horizontally-extending conductive structures.

Thus, in accordance with embodiments of the disclosure, a microelectronic device comprises a stack structure, contact structures, string drivers, a triple well structure, a select gate structure, semiconductive pillar structures, and a select gate contact structure. The stack structure has tiers each comprising a conductive structure and an insulating structure vertically-neighboring the conductive structure, and comprises a staircase region comprising staircase structures having steps comprising horizontal ends of the tiers, a select gate contact region, and a memory array region between the staircase region and the select gate contact region. The contact structures are on at least some of the steps of the staircase structures. The string drivers are electrically coupled to the contact structures and comprise transistors underlying and within horizontal boundaries of the staircase region. The triple well structure underlies and is within horizontal boundaries of the memory array region. The select gate structure is between the stack structure and the triple well structure. The semiconductive pillar structures are within horizontal boundaries of the memory array region and extend through the stack structure and the select gate structure and to the triple well structure. The select gate contact structure is within horizontal boundaries of the select gate contact region and extends through the stack structure and to the select gate structure.

Furthermore, in accordance with additional embodiments of the disclosure, a memory device comprises a stack structure, staircase structures, string driver transistors, a select gate structure, a select gate contact structure, and vertically-extending strings of memory cells. The stack structure comprises alternating conductive structures and insulating structures arranged in tiers, each of the tiers individually comprising one of the conductive structures and one of the insulating structures. The staircase structures are within the stack structure and have steps comprising edges of the tiers. The string driver transistors underlie the staircase structures and are electrically connected to the conductive structures of the stack structure. The string driver transistors share a gate structure with one another. The select gate structure underlies the stack structure and horizontally neighbors the gate structure of the string driver transistors. The select gate contact structure is in electrical contact with the select gate structure and extends through the stack structure. The vertically-extending strings of memory cells are within the stack structure and are horizontally interposed between the staircase structures and select gate contact structure.

Moreover, in accordance with further embodiments of the disclosure, a 3D NAND Flash memory device comprises a stack structure, stadium structures, HVNMOS transistors, conductive structures, an SGS structure, an SGS contact structure, a triple well structure, and pillar structures. The stack structure comprises tiers each comprising a word line plate and an insulating structure vertically-neighboring the word line plate. The stadium structures are distributed within the stack structure and each comprises staircase structures having steps comprising edges of the tiers. The HVNMOS transistors underlie the stack structure. The conductive structures extend from and between the HVNMOS transistors and at least some of the steps of the staircase structures. The SGS structure underlies the stack structure and horizontally neighbors the HVNMOS transistors. The SGS contact structure extends through the stack structure and to the SGS structure. The triple well structure underlies the SGS structure. The pillar structures extend through the stack structure and the SGS structure and to the triple well structure. The pillar structures horizontally intervene between the stadium structures and the SGS contact structure, and each comprise a semiconductive pillar at least partially surrounded by one or more charge storage structures.

Figure 2:
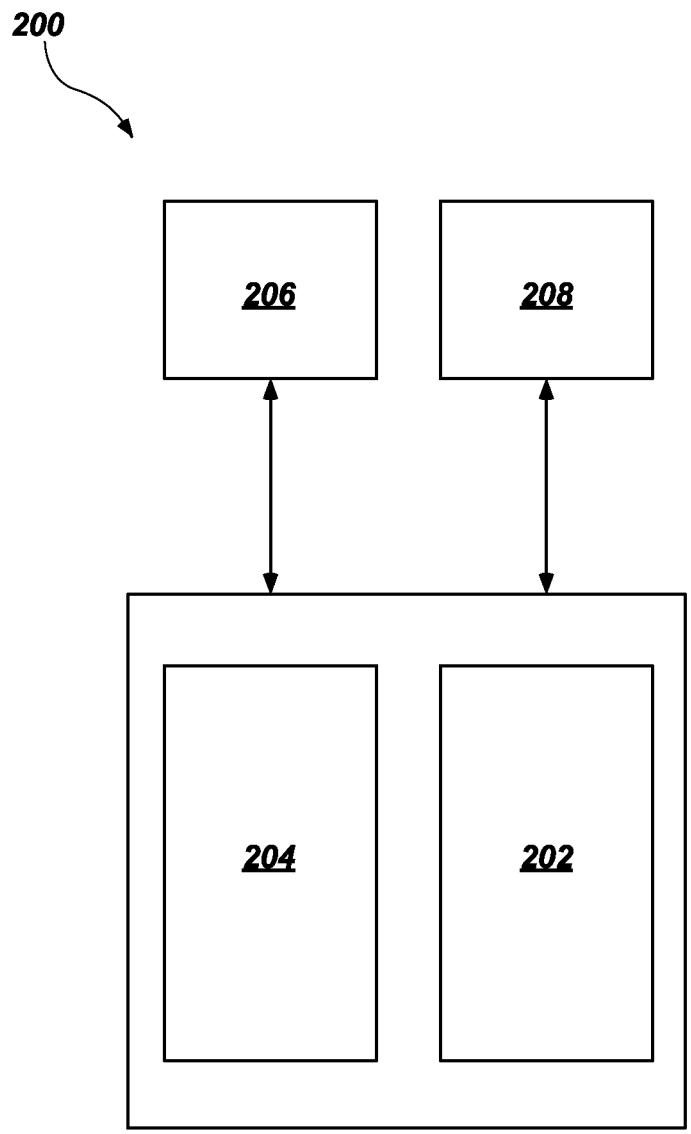
FIG. 2 is a schematic block diagram illustrating an electronic system, in accordance with embodiments of the disclosure.

Microelectronic devices (e.g., the microelectronic device 100 previously described with reference to FIGS. 1A and 1B) in accordance with embodiments of the disclosure may be used in embodiments of electronic systems of the disclosure. For example, FIG. 2 is a block diagram of an illustrative electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 200 includes at least one memory device 202. The memory device 202 may comprise, for example, an embodiment of a microelectronic device (e.g., the microelectronic device 100 previously described with reference to FIGS. 1A and 1B) previously described herein.

The electronic system 200 may further include at least one electronic signal processor device 204 (often referred to as a "microprocessor"). The electronic signal processor device 204 may, optionally, include an embodiment a microelectronic device (e.g., the microelectronic device 100 previously described with reference to FIGS. 1A and 1B) previously described herein. While the memory device 202 and the electronic signal processor device 204 are depicted as two (2) separate devices in FIG. 2, in additional embodiments, a single (e.g., only one) memory/processor device having the functionalities of the memory device 202 and the electronic signal processor device 204 is included in the electronic system 200. In such embodiments, the memory/processor device may include an embodiment a microelectronic device (e.g., the microelectronic device 100 previously described with reference to FIGS. 1A and 1B) previously described herein. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touchscreen device that can be used both to input information to the electronic system 200 and to output visual information to a user. The input device 206 and the output device 208 may communicate electrically with one or more of the memory device 202 and the electronic signal processor device 204.

Thus, in accordance with embodiments of the disclosure, an electronic system comprises an input device, an output device, a processor device operably coupled to the input device and the output device, and a memory device operably coupled to the processor device. The memory device comprises a conductive stack structure, staircase structures, vertical contact structures, string drivers, a select gate structure, a vertical select gate contact structure, a triple well structure, digit lines, and vertical pillar structures. The conductive stack structure comprises alternating conductive structures and insulating structures arranged in tiers, each of the tiers individually comprising one of the conductive structures and one of the insulating structures. The staircase structures are distributed within a portion of the conductive stack structure and comprise steps comprising horizontal ends of the tiers. The vertical contact structures are on at least some of the steps of the staircase structures. The string drivers underlie the portion of the conductive stack structure and are electrically coupled to the vertical contact structures. The select gate structure underlies an additional portion of the conductive stack structure. The vertical select gate contact structure extends through the additional portion conductive stack structure and to the select gate structure. The triple well structure underlies the select gate structure. The digit lines overlie the additional portion of conductive stack structure. The vertical pillar structures horizontally intervene between the vertical contact structures and the vertical select gate contact structure and extend from the digit lines, through the conductive stack structure and the select gate structure, and to the triple well structure.

The structures, devices, and systems of the disclosure advantageously facilitate one or more of improved simplicity, greater packaging density, and increased miniaturization of components as compared to conventional structures, conventional devices, and conventional systems. For example, the configurations of the microelectronic devices (e.g., the microelectronic device 100, including the stack structure 102 exhibiting the memory array region 102A interposed between the distributed staircase region 102B and the select gate contact region 102C) of the disclosure facilitate robust 3D memory (e.g., 3D NAND Flash memory) architectures exhibiting less conductive routing (e.g., access line routing, word line routing) congestion and/or smaller horizontal dimensions as compared to conventional microelectronic devices. The structures, devices, and systems of the disclosure may reduce costs (e.g., manufacturing costs, material costs) and performance, scalability, efficiency, and simplicity as compared to conventional structures, conventional devices, and conventional systems.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure having tiers each comprising a conductive structure and an insulating structure vertically-neighboring the conductive structure, the stack structure comprising:
a staircase region comprising staircase structures having steps comprising horizontal ends of the tiers;
a select gate contact region; and
a memory array region between the staircase region and the select gate contact region;
contact structures on at least some of the steps of the staircase structures;
string drivers electrically coupled to the contact structures and comprising transistors underlying and within horizontal boundaries of the staircase region;
a triple well structure underlying and within horizontal boundaries of the memory array region;
a select gate structure between the stack structure and the triple well structure;
semiconductive pillar structures within horizontal boundaries of the memory array region and extending through the stack structure and the select gate structure and to the triple well structure; and
a select gate contact structure within horizontal boundaries of the select gate contact region and extending through the stack structure and to the select gate structure.

2. The microelectronic device of claim 1, wherein the staircase region of the stack structure comprises multiple stadium structures each comprising two of the staircase structures mirroring one another, at least one of the multiple stadium structures located at a different vertical position within the stack structure than at least one other of the multiple stadium structures.

3. The microelectronic device of claim 1, wherein the transistors of the string drivers share a gate structure, the gate structure horizontally neighboring and located at substantially the same vertical position as the select gate structure.

4. The microelectronic device of claim 3, wherein a material composition of the gate structure is substantially the same as a material composition of the select gate structure.

5. The microelectronic device of claim 3, wherein the gate structure, the select gate structure, and the conductive structure of each of the tiers of the stack structure have substantially the same material composition as one another.

6. The microelectronic device of claim 1, further comprising conductive routing structures extending from and between the contact structures and the transistors of the string drivers.

7. The microelectronic device of claim 1, wherein the triple well structure comprises:
a P-type base structure;
an N-well within the P-type base structure; and
a P-well within the N-well and vertically adjacent the select gate structure.

8. The microelectronic device of claim 1, wherein each of the semiconductive pillar structures comprises:
a semiconductive pillar; and
one or more charge storage structures at least partially surrounding the semiconductive pillar.

9. The microelectronic device of claim 1, wherein a material composition of the select gate contact structure is substantially the same as a material composition of the contact structures.

10. The microelectronic device of claim 1, further comprising digit lines overlying and within horizontal boundaries of the memory array region, the digit lines electrically coupled to the semiconductive pillar structures.

11. A memory device, comprising:
a stack structure comprising alternating conductive structures and insulating structures arranged in tiers, each of the tiers individually comprising one of the conductive structures and one of the insulating structures;
staircase structures within the stack structure and having steps comprising edges of the tiers;
string driver transistors underlying the staircase structures and electrically connected to the conductive structures of the stack structure, the string driver transistors sharing a gate structure with one another;
a select gate structure underlying the stack structure and horizontally neighboring the gate structure of the string driver transistors;
a select gate contact structure in electrical contact with the select gate structure and extending through the stack structure; and
vertically-extending strings of memory cells within the stack structure and horizontally interposed between the staircase structures and select gate contact structure.

12. The memory device of claim 11, wherein a thickness of the select gate structure is greater than a thickness of each of the conductive structures of the stack structure.

13. The memory device of claim 11, wherein the select gate structure comprises an SGS structure.

14. The memory device of claim 11, wherein the gate structure of the string driver transistors and the select gate structure are vertically offset from a lower boundary of the stack structure by substantially the same distance.

15. The memory device of claim 11, wherein the string driver transistors comprise HVNMOS transistors.

16. The memory device of claim 11, further comprising:
a triple well structure underlying the select gate structure and in electrical contact with the vertically-extending strings of memory cells; and
digit lines overlying the stack structure and in electrical contact with the vertically-extending strings of memory cells.

17. The memory device of claim 11, wherein the vertically-extending strings of memory cells comprise vertically-extending strings of MONOS memory cells.

18. A 3D NAND Flash memory device, comprising:
a stack structure comprising tiers each comprising a word line plate and an insulating structure vertically-neighboring the word line plate;
stadium structures distributed within the stack structure and each comprising staircase structures having steps comprising edges of the tiers;
HVNMOS transistors underlying the stack structure;
conductive structures extending from and between the HVNMOS transistors and at least some of the steps of the staircase structures;
an SGS structure underlying the stack structure and horizontally neighboring the HVNMOS transistors;
an SGS contact structure extending through the stack structure and to the SGS structure;
a triple well structure underlying the SGS structure; and
pillar structures extending through the stack structure and the SGS structure and to the triple well structure, the pillar structures horizontally intervening between the stadium structures and the SGS contact structure and each comprising a semiconductive pillar at least partially surrounded by one or more charge storage structures.

19. The 3D NAND Flash memory device of claim 18, wherein the word line plate of each of the tiers of the stack structure comprises tungsten.

20. The 3D NAND Flash memory device of claim 18, wherein each of the stadium structures individually comprises a first of the staircase structures mirroring a second of the staircase structures.

21. The 3D NAND Flash memory device of claim 18, wherein at least one of the stadium structures located relatively more horizontally proximate to the pillar structures is located at a higher vertical position than at least one other of the stadium structures located relatively more horizontally distal from the pillar structures.

22. The 3D NAND Flash memory device of claim 18, wherein the conductive structures comprise:
vertically-extending conductive contact structures physically contacting the at least some of the steps of the staircase structures; and
conductive routing structures extending from and between the vertically-extending conductive contact structures and the HVNMOS transistors, the conductive routing structures each comprising horizontally-extending regions and vertically-extending regions.

23. The 3D NAND Flash memory device of claim 18, wherein the one or more charge storage structures of the pillar structures comprise one or more charge trapping structures.

24. An electronic system, comprising:
an input device;
an output device;
a processor device operably coupled to the input device and the output device; and
a memory device operably coupled to the processor device and comprising:
a conductive stack structure comprising alternating conductive structures and insulating structures arranged in tiers, each of the tiers individually comprising one of the conductive structures and one of the insulating structures;
staircase structures distributed within a portion of the conductive stack structure and comprising steps comprising horizontal ends of the tiers;
vertical contact structures on at least some of the steps of the staircase structures;

string drivers underlying the portion of the conductive stack structure and electrically coupled to the vertical contact structures;

a select gate structure underlying an additional portion of the conductive stack structure;

a vertical select gate contact structure extending through the additional portion conductive stack structure and to the select gate structure;

a triple well structure underlying the select gate structure;

digit lines overlying the additional portion of conductive stack structure; and vertical pillar structures horizontally intervening between the vertical contact structures and the vertical select gate contact structure and extending from the digit lines, through the conductive stack structure and the select gate structure, and to the triple well structure.

25. The electronic system of claim 24, wherein the memory device comprises a 3D NAND Flash memory device.

* * * * *